United States Patent [19]

Tsunashima et al.

[11] Patent Number: 5,605,574
[45] Date of Patent: Feb. 25, 1997

[54] SEMICONDUCTOR WAFER SUPPORT APPARATUS AND METHOD

[75] Inventors: Yoshitaka Tsunashima; Katsuya Okumura, both of Poughkeepsie, N.Y.

[73] Assignee: Kabushiki Kaisha Toshiba, Kawasaki, Japan

[21] Appl. No.: 530,641

[22] Filed: Sep. 20, 1995

[51] Int. Cl.$^6$ ............................................. C23C 16/00
[52] U.S. Cl. ........................ 118/500; 118/728; 269/289 R; 264/81
[58] Field of Search ........................... 118/728, 500; 269/289 R; 264/81

[56] References Cited

U.S. PATENT DOCUMENTS

| | | | |
|---|---|---|---|
| 3,084,928 | 4/1963 | Opitz | 269/21 |
| 3,712,143 | 1/1973 | Weaver | 73/407 R |
| 4,138,692 | 2/1979 | Meeker | 357/82 |
| 4,530,635 | 7/1985 | Engelbrecht | 414/627 |
| 4,540,326 | 9/1985 | Southworth | 414/217 |
| 4,557,514 | 12/1985 | Cushman | 294/64.1 |
| 4,944,860 | 7/1990 | Bramhall | 204/298.23 |
| 5,100,502 | 3/1992 | Murdoch | 156/643 |
| 5,224,406 | 7/1993 | Nasu | 83/422 |
| 5,245,736 | 9/1993 | Schertler | 29/33 P |
| 5,266,119 | 11/1993 | Taniguchi | 118/730 |

*Primary Examiner*—Richard Bueker
*Attorney, Agent, or Firm*—Banner & Witcoff, Ltd.

[57] ABSTRACT

The wafer support apparatus and method provide a plurality of elastic supports having a smooth curvature for contacting a wafer at a respective plurality of support points. Each elastic support directly contacts the wafer at a support point and expands and/or compresses independently of the other elastic supports to accommodate the bending of the wafer during processing.

A wafer support apparatus includes a plurality of flexible elastic supports onto which a wafer is directly positioned, wherein each of the plurality of elastic supports holds the wafer during processing by compressing or expanding in response to bending of the wafer during processing to provide continuous even support for the wafer during processing. A wafer support method includes the steps of providing a plurality of flexible elastic supports and positioning a wafer to be processed directly on the plurality of elastic supports, wherein each of the plurality of elastic supports holds the wafer during processing by compressing or expanding in response to bending of the wafer during processing to provide continuous even support for the wafer during processing.

The elastic supports may be manufactured using a method including the steps of providing a mold in the shape of a wafer elastic support; depositing a layer of an elastic material having low thermal expansion coefficient on the mold; forming a hole in the deposited layer of elastic material at the base of the mold; and burning out the mold.

23 Claims, 6 Drawing Sheets

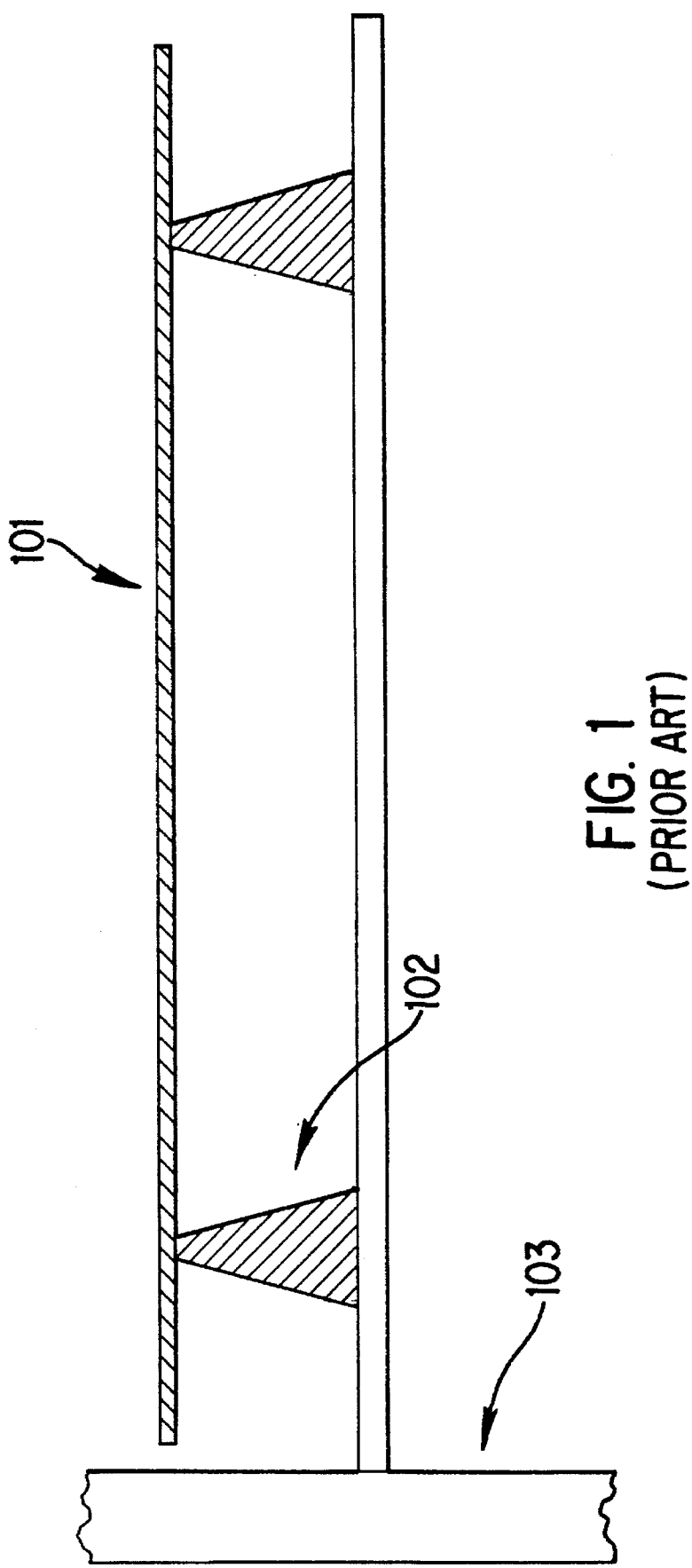

SEMICONDUCTOR WAFER SUPPORT APPARATUS AND METHOD

FIELD OF THE INVENTION

The present invention generally relates to an apparatus and method for supporting semiconductor wafers during processing. The present invention further relates to a method of manufacturing supports for supporting the semiconductor wafers during processing.

BACKGROUND OF THE INVENTION

Semiconductor devices such as DRAMS and EPROMS are typically formed on semiconductor wafers, e.g., silicon wafers. During the fabrication of such devices, the wafers are handled and positioned many times as they are moved, e.g., from a carder to a position in a cleaning boat, to an oxidation boat, to a tester, etc. During fabrication processing, the wafer must be handled and supported with great care to minimize wafer damage. Wafers may be supported during processing using an arrangement as shown in FIG. 1.

With reference to FIG. 1, the wafers 101 may be supported by three supports 102 (two shown) connected to a support boat 103. As the wafers are processed, the high temperature of some processing steps, such as oxidation, diffusion, annealing and low pressure chemical vapor deposition (LPCVD), lowers the shearing yield stress of the wafers. In this context, the shearing yield stress of the wafer is the shearing stress at which the wafer shears. For example, at 1100° C., a silicon wafer has a shearing yield stress of approximately 0.07 Kgf/mm$^2$. If the shear stress between one of the supports 102 and the semiconductor wafer exceeds this shearing yield stress, crystal defects such as slips are generated, adversely impacting on device performance.

Using the support arrangement shown in FIG. 1, for wafers having a relatively small diameter, for example, a diameter of 200 mm, the shear stress between each of the supports and the wafer caused by the wafer weight itself is approximately 0.028 Kgf/mm$^2$ when the supports are positioned approximately 12.5 mm (distance shown as "x" in FIG. 1A) from the edge of the wafer. As a result, there is little danger that the shear stress between the supports and the wafer will exceed the yield point during high-temperature processing and cause crystal defects in the wafer.

However, larger wafers experience a larger shear stress as the result of heavy weight of the wafer itself. For example, using the support arrangement shown in FIG. 1, the shear stress between each of the supports and a wafer having a 300 mm diameter is approximately 0.062 Kgf/mm$^2$ when the supports are positioned approximately 18.8 mm (distance shown as "x" in FIG. 1A) from the edge of the wafer, and the shear stress between each of the supports and a wafer having a 350 mm diameter is approximately 0.078 Kgf/mm$^2$ when the supports are positioned approximately 21.9 mm (distance "x" in FIG. 1A) from the edge of the wafer. Therefore, there is a greater danger that the shear stress on the wafer (caused by the weight of the wafer) during high temperature processing will exceed the shearing yield point.

One method of reducing the shear stress on the wafer is to increase the number of supports on which the wafer is positioned. However, it is very difficult to support a wafer equally using more than three supports. Specifically, the wafer may bend (warp) during high temperature processing and particularly during temperature ramp ups (when the temperature of the wafer is rapidly increased) and ramp downs (when the temperature of the wafer is rapidly decreased), resulting in uneven support of the wafer by the supports. For example, as illustrated in FIG. 1A, warping of a wafer 101 during processing may result in increased shearing stress on the wafer at point B because the wafer is no longer supported at point A. Since the wafer is not supported equally by all of the supports, shear stress may reach critical levels at the supports that support larger percentages of the wafer's weight. It is preferable to evenly distribute the weight of the wafer, for example, at points C and D shown in FIG. 1B. However, known support methods do not provide for even support of a wafer as the wafer warps during processing.

SUMMARY OF THE INVENTION

In view of the drawbacks of the known support method as described above, the present invention provides an apparatus and method for supporting wafers during high temperature processing. The apparatus and method according to the present invention achieve small shear stress at the supporting points while accommodating wafer warping during high temperature processing and particularly during temperature ramp ups and ramp downs. This is particularly advantageous for the support of large diameter semiconductor wafers.

The wafer support apparatus and method according to the present invention provide a plurality of elastic supports for contacting and supporting a wafer at a corresponding plurality of support points. Each elastic support directly contacts the wafer at a support point and compresses and/or expands independently of the other elastic supports to accommodate the warping of the wafer during processing.

A wafer support apparatus according to the present invention includes a plurality of flexible elastic supports onto which a wafer is directly positioned, wherein each of the plurality of elastic supports support the wafer during processing by compressing or expanding in response to bending or warping of the wafer during processing to provide continuous uniform support for the wafer during processing.

A wafer support method according to the present invention includes the steps of providing a plurality of flexible elastic supports and positioning a wafer to be processed directly on the plurality of elastic supports, wherein each of the plurality of elastic supports supports the wafer during processing by compressing or expanding in response to bending of the wafer during processing to provide continuous even support for the wafer during processing.

The elastic supports according to the present invention may be manufactured using a method including the steps of providing a mold in the shape of a wafer elastic support; depositing a layer of an elastic material having a low thermal coefficient of expansion (a high thermal-proof) on the mold; forming a hole in the deposited layer of elastic material at the base of the mold; and burning out the mold.

Various additional advantages and features of novelty which characterize the invention are further pointed out in the claims that follow. However, for a better understanding of the invention and its advantages, reference should be made to the accompanying drawings and descriptive matter which illustrate and describe preferred embodiments of the invention.

BRIEF DESCRIPTION OF THE DRAWINGS

FIG. 1 provides a diagram of a prior art wafer support apparatus.

DETAILED DESCRIPTION

The wafer support apparatus and method and the elastic support manufacturing method according to the present invention will now be described with reference to the drawings.

Figure 2A:
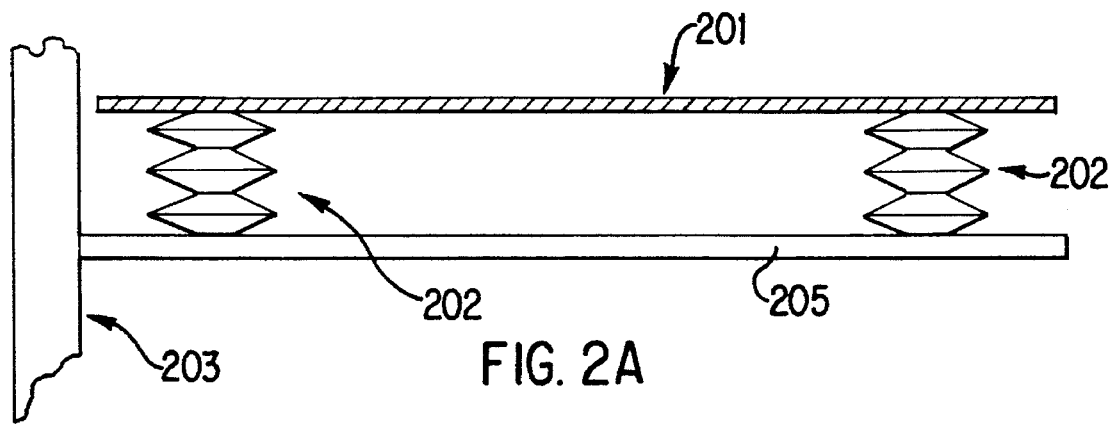
FIGS. 2A and 2B provide diagrams of a wafer support apparatus according to the present invention including a plurality of curved elastic supports for supporting a wafer.

A side schematic view of a wafer support apparatus according to the present invention is shown in FIG. 2A. Illustrations of a cross section of the wafer support apparatus are provided in FIGS. 5 and 7 (discussed below). A wafer 201 is supported by a plurality of bellows-like elastic supports 202 which expand and contract to maintain continuous uniform contact with the wafer during processing. As is more clearly shown in FIGS. 5 and 6, the elastic supports each have a smoothly curved upper surface in order to maintain a point contact with the wafer even if the wafer warps during processing. The elastic supports support the wafer 201 above the surface of a platform 205 of a support boat 203. The elastic supports may have a height of approximately 5–25 mm and a diameter of approximately 5–20 mm depending upon the size of the wafer and other processing considerations. The wafer 201 may be a silicon (Si) wafer, and the elastic supports 202 may be fabricated of SiC or other suitable materials having a low thermal coefficient of expansion. The support boat 203 (including platform 205) may be fabricated of SiC, quartz, or other suitable materials. The elastic supports 202-cooperate to overcome the drawbacks of the known wafer support arrangements by maintaining continuous uniform contact with the wafer when the wafer warps during processing, thereby reducing the shear stress on the wafer. This reduction in shear stress at the support points decreases the possibility that these stresses will exceed the yield point and cause crystal defects.

Figure 2B:
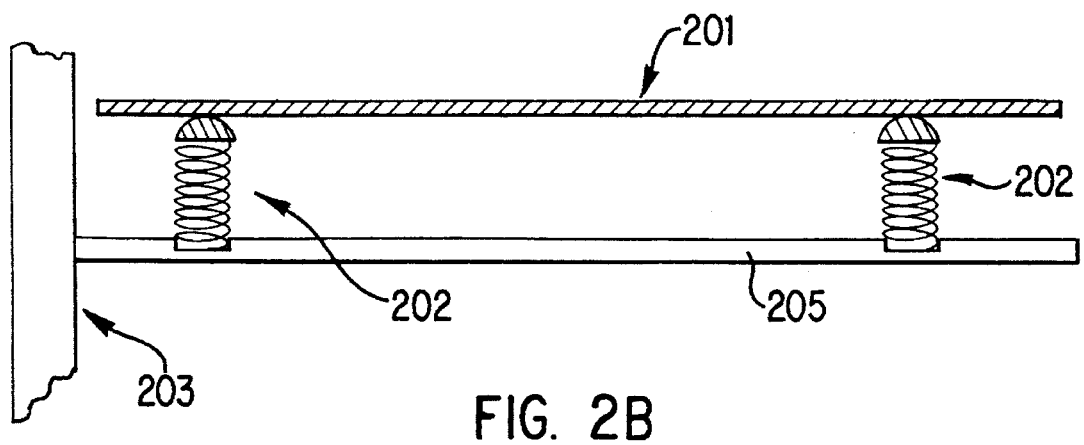

A similar wafer support structure is shown in FIG. 2B, wherein the elastic supports 202 are elastic springs manufactured, for example, of SiC. The other features of the wafer support structure shown in FIG. 2B correspond to those shown in FIG. 2A.

Figure 1A:
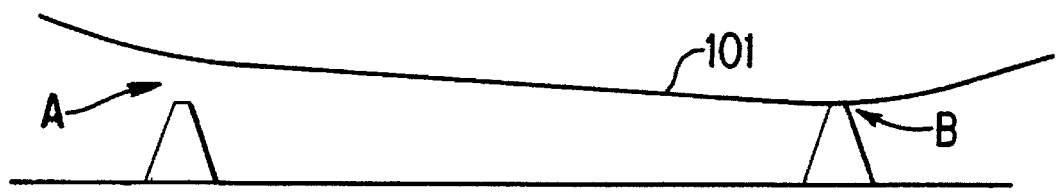
FIG. 1A provides an illustration of an improperly supported wafer.
Figure 1B:
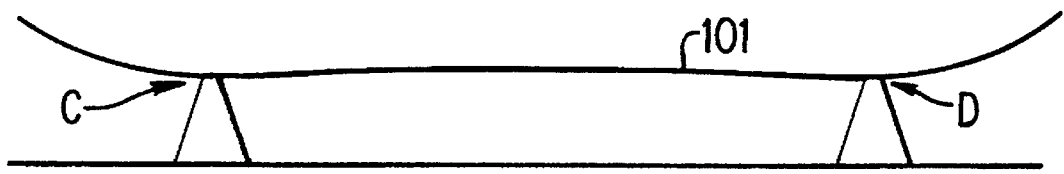
FIG. 1B provides an illustration of a properly supported wafer.
Figure 4:
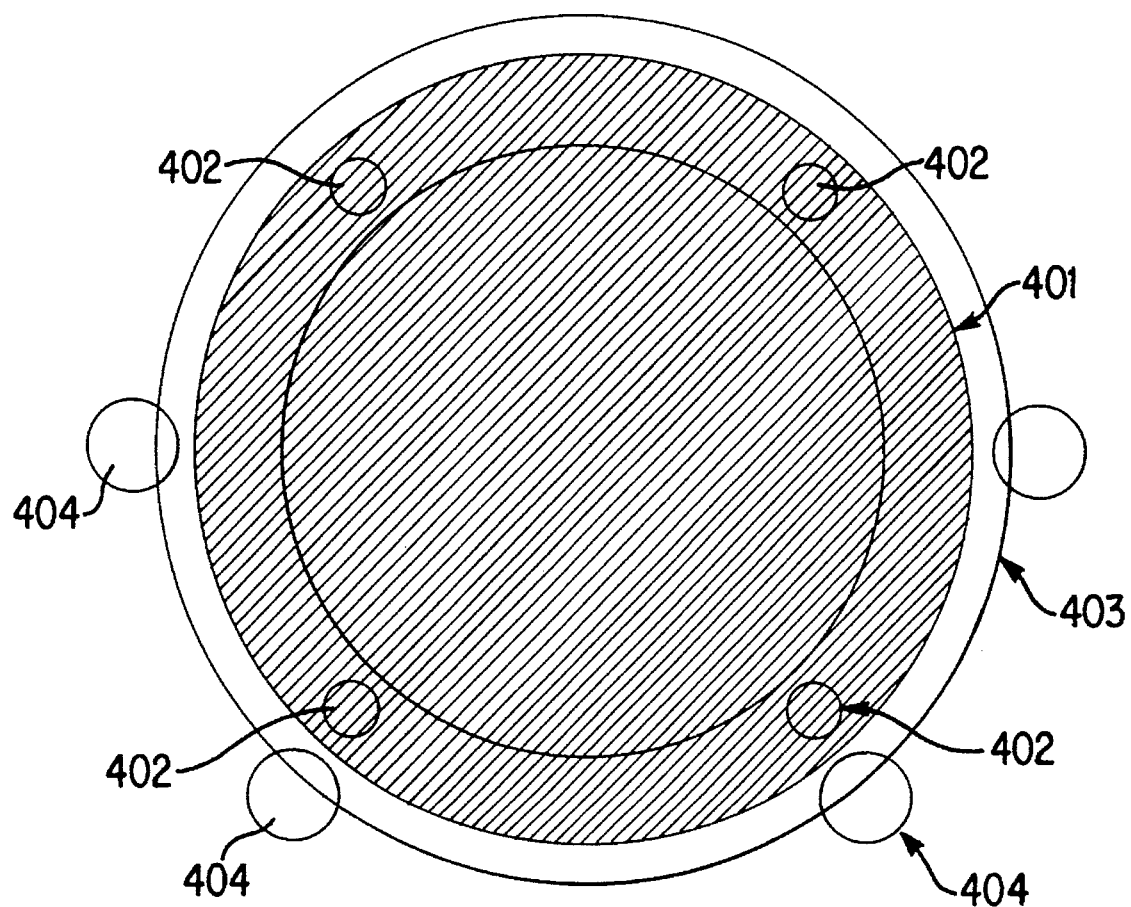
FIG. 4 provides a top-down view of a wafer support apparatus according to the present invention.

FIG. 4 provides a top-down view of a wafer support apparatus according to the present invention as shown in FIG. 2. Four elastic supports 402 are shown in FIG. 4. The wafer is positioned on the supports, for example, as shown in FIG. 1. However, the present invention is not limited to this number of elastic supports, such that more or less elastic supports may be used to support the wafer 401. Preferably, more than three elastic supports are used to support the wafer.

The wafer support apparatus also includes a support platform 403, for example, an SiC ring, and four rods 404 which support the platform 403. The rods 404 may also be made of SiC.

Figure 5A:
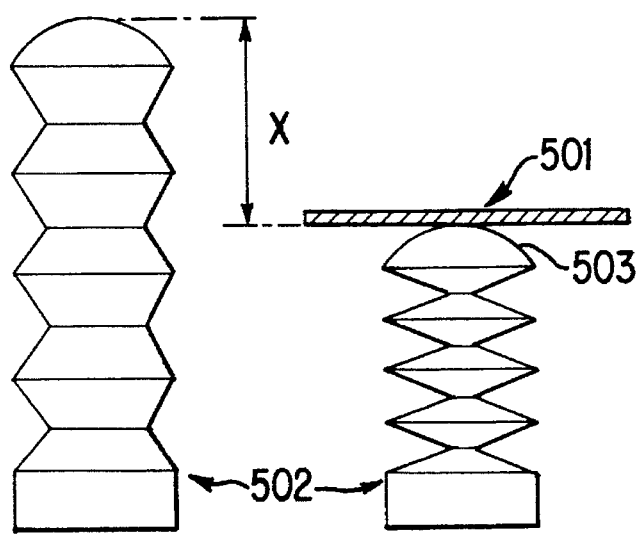
FIG. 5A provides an illustration of the movement of an elastic support to accommodate the weight of a wafer.
Figure 5B:
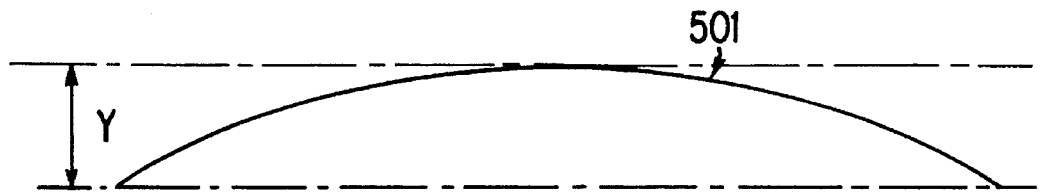
FIG. 5B provides an illustration of the maximum warping of a wafer during processing.

FIGS. 5A and 5B illustrate the adjustment (compression and/or expansion) of each individual elastic support 502 to accommodate a wafer 501. In FIG. 5A, an elastic support 502 is compressed a distance X as a result of the weight of the wafer 501. A curved upper portion 503 of the elastic support 502 contacts the wafer 501 at a point, thereby providing a support point for the wafer 501.

As shown in FIG. 5B, the wafer 501 may warp during high temperature processing, and particularly during temperature ramp ups and ramp downs. The elastic support 502 may be designed such that the maximum warp Y of the wafer 501 is substantially less than the compression distance X of the elastic support 502 as a result of the wafer's weight to insure that the elastic support 502 remains in contact with the wafer 501 at all times during processing.

Figure 3:
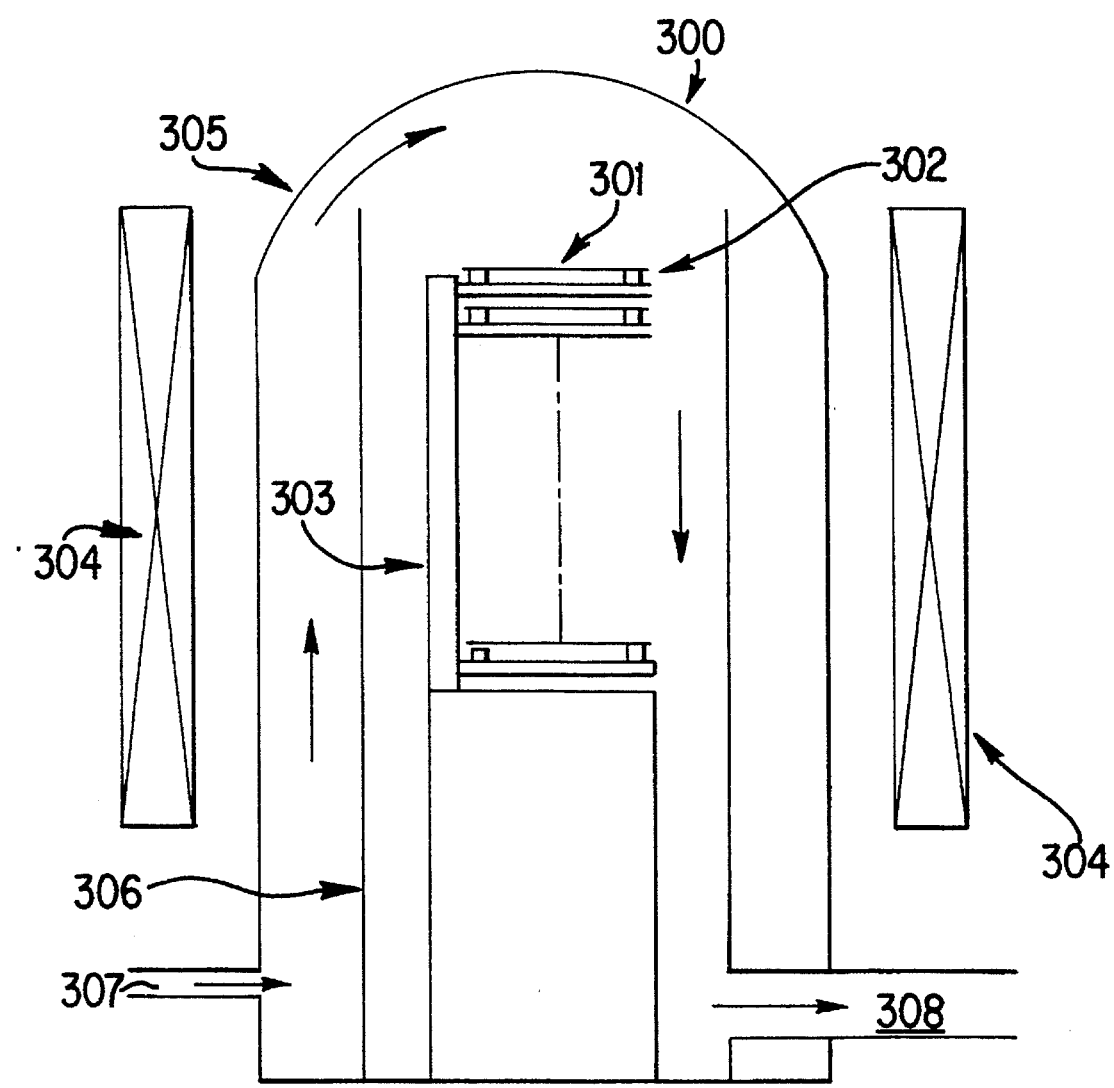
FIG. 3 provides a diagram of a batch type furnace including a SiC or quartz boat and a plurality of wafer supports as shown in FIG. 2.

The wafer support apparatus shown in FIG. 2, for example, may be incorporated into a batch type furnace 300 as shown in FIG. 3. A plurality of wafers 301 are each supported above one platform of a support boat 303 by a plurality of elastic supports 302. The elastic supports 302 may be fabricated of SiC or any other suitable material having a high thermal-proof. The support boat 303 may be made of SiC, quartz, or any other suitable material.

The batch type furnace 303 also includes two heaters 304, an outer tube 305, an inner tube 306, a gas inlet 307, and an exhaust port 308 as known in the art. The wafer support apparatus according to the present invention may also be used in batch type furnaces of different constructions.

Furthermore, use of the wafer support apparatus according to the present invention is not limited to batch type applications and may be used in single wafer tools, for example, a rapid thermal annealer using a lamp heater, that have similar high temperature processes.

The wafer support apparatus according to the present invention may be used to accomplish the wafer support method according to the present invention. This method includes the steps of providing a plurality of flexible elastic supports and positioning a wafer to be processed directly onto the plurality of elastic supports. Each of the elastic supports holds the wafer during processing by compressing or expanding in response to waxping or bending of the wafer during processing to provide continuous uniform support for the wafer during processing. The smooth curved tips of the elastic supports contact the wafer at a support point throughout processing of the wafer.

Figure 6A:
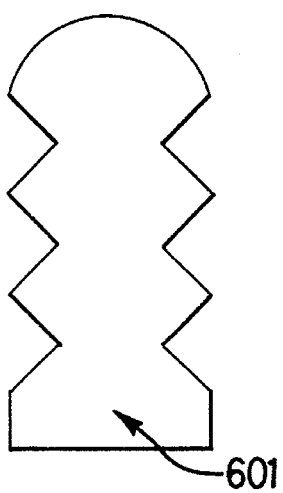
FIGS. 6A–6D illustrate a method of manufacturing an elastic support according to the present invention.
Figure 6B:
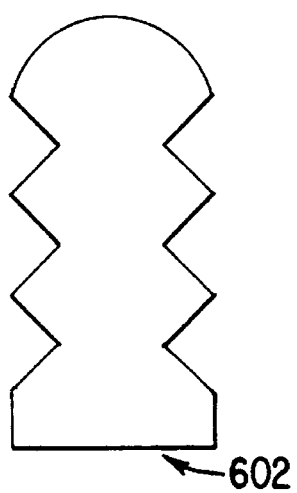
Figure 6C:
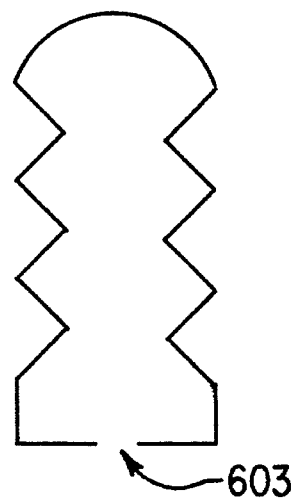
Figure 6D:
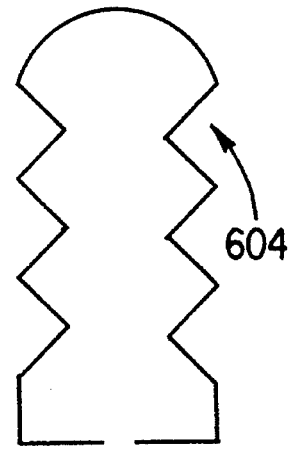

A method of manufacturing an elastic support as used in the wafer support apparatus and method according to the present invention will now be described with reference to Figures 6A–6D. In FIG. 6A, a carbon mold 601 is formed in the desired elastic support shape. In FIG. 6B, a layer 602 of SiC or other suitable elastic material is deposited on the carbon mold using, for example, a chemical vapor deposition (CVD) process. The layer of SiC may have a thickness of 100 to 1000 um. In FIG. 6C, a hole 603 is formed in the deposited SiC layer at the bottom of the mold, for example, using mechanical machining. In FIG. 6D, the carbon mold is burned out, for example, using oxidation at high temperatures, leaving the remaining SiC layer and thereby forming an elastic support 604.

The elastic supports for use in the wafer support apparatus and method according to the present invention may be manufactured from SiC or any other suitable elastic material having a high thermal-proof and sufficient elasticity to provide the requisite support for the wafer.

While the present invention has been particularly described with reference to the preferred embodiments, it should be readily apparent to those of ordinary skill in the art that changes and modifications in form and details may be made without departing from the spirit and scope of the invention. It is intended that the appended claims include such changes and modifications.

We claim:

1. A support apparatus for a semiconductor wafer, comprising:
   a plurality of flexible elastic supports onto which said semiconductor wafer is directly positioned, wherein each of said plurality of flexible elastic supports supports said wafer during processing by compressing or expanding in response to bending of said wafer during said processing to provide continuous support for said wafer during said processing.

2. A wafer support apparatus according to claim 1, wherein said plurality of flexible elastic supports are ceramic.

3. A wafer support apparatus according to claim 1, wherein each of said plurality of flexible elastic supports has a smooth curved tip for contacting said wafer at a support point.

4. A wafer support apparatus according to claim 1, wherein a distance X through which each said elastic support is compressed by the weight of said wafer is greater than a maximum bending distance Y of said wafer during said processing.

5. A support apparatus for a semiconductor wafer, comprising:
   a plurality of flexible elastic supports onto which said semiconductor wafer is directly positioned, wherein each of said plurality of flexible elastic supports supports said wafer during processing by compressing or expanding in response to bending of said wafer during said processing to provide continuous support for said wafer during said processing;
   wherein each of said flexible elastic supports has a smooth upper surface for contacting a wafer to minimize a contact area between said support and said wafer and a spring-like lower portion which extends and compresses in response to the weight of the wafer and changes in the curvature of the wafer during processing.

6. A wafer support apparatus according to claim 5, wherein said plurality of flexible elastic supports are ceramic.

7. A wafer support apparatus according to claim 5, wherein four of said plurality of flexible elastic supports are employed to support said wafer.

8. A wafer support apparatus according to claim 7, wherein said four supports are positioned in a square pattern beneath said wafer.

9. A wafer support apparatus according to claim 5, wherein a distance X through which each said elastic support is compressed by the weight of said wafer is greater than a maximum bending distance Y of said wafer during said processing.

10. A wafer support apparatus according to claim 5, wherein each said supports has a height of approximately 5 to 25 millimeters.

11. A wafer support apparatus according to claim 5, wherein each said supports has a diameter of approximately 5 to 20 millimeters.

12. A wafer support method, comprising the steps of:
    providing a plurality of flexible elastic supports; and
    positioning a wafer to be processed directly on said plurality of flexible elastic supports,
    wherein each of said plurality of flexible elastic supports holds said wafer during processing by compressing or expanding in response to bending of said wafer during said processing to provide continuous support for said wafer during said processing.

13. A wafer support method according to claim 12, wherein said plurality of flexible elastic supports are ceramic.

14. A wafer support method according to claim 12, wherein each of said plurality of flexible elastic supports has a smooth curved tip for contacting said wafer at a support point.

15. A wafer support method according to claim 12, wherein a distance X through which each said flexible elastic support is compressed by the weight of said wafer is greater than a maximum bending distance Y of said wafer during said processing.

16. A method of manufacturing a wafer elastic support, comprising the steps of:
    providing a mold in the shape of a wafer elastic support;
    depositing a layer of an elastic material having a low thermal expansion coefficient on said mold;
    forming a hole in said deposited layer of elastic material at a base of said mold; and
    burning out said mold.

17. A method according to claim 16, wherein said elastic material is SiC.

18. A method according to claim 16, wherein said layer of elastic material has a thickness of between 100 and 1000 um.

19. A method according to claim 16, wherein said wafer elastic support has a smooth curved support tip for contacting a wafer to be supported.

20. A method according to claim 16, wherein said mold is a carbon mold.

21. A method according to claim 16, wherein said layer of elastic material is deposited using a chemical vapor deposition process.

22. A method according to claim 16, wherein said hole is formed by a mechanical machining process.

23. A method according to claim 16, wherein said burning out step is performed by a high-temperature oxidation process.

* * * * *